United States Patent
Szopko

(10) Patent No.: US 9,667,216 B2
(45) Date of Patent: May 30, 2017

(54) WIDEBAND TUNABLE COMBINER SYSTEM

(71) Applicant: Shure Acquisition Holdings, Inc., Niles, IL (US)

(72) Inventor: Robert Szopko, Downers Grove, IL (US)

(73) Assignee: Shure Acquisition Holdings, Inc., Niles, IL (US)

( * ) Notice: Subject to any disclaimer, the term of this patent is extended or adjusted under 35 U.S.C. 154(b) by 0 days.

(21) Appl. No.: 14/824,619

(22) Filed: Aug. 12, 2015

(65) Prior Publication Data

US 2017/0047904 A1 Feb. 16, 2017

(51) Int. Cl.
H03H 7/46 (2006.01)
H03H 7/01 (2006.01)
H01F 38/14 (2006.01)

(52) U.S. Cl.
CPC ........... *H03H 7/0161* (2013.01); *H01F 38/14* (2013.01)

(58) Field of Classification Search
CPC .................................. H03H 7/46; H01F 38/14
USPC ......................................................... 333/132
See application file for complete search history.

(56) References Cited

U.S. PATENT DOCUMENTS

| | | |
|---|---|---|
| 3,815,055 A | 6/1974 | Plunk et al. |
| 5,493,695 A | 2/1996 | Aitkenhead et al. |
| 6,005,442 A | 12/1999 | Maeda et al. |
| 7,015,772 B2 | 3/2006 | Ji |
| 8,791,771 B2 | 7/2014 | Ding et al. |
| 2009/0285135 A1 | 11/2009 | Rousu et al. |
| 2011/0063045 A1 | 3/2011 | Jones et al. |

OTHER PUBLICATIONS

International Search Report and Written Opinion for PCT/US2016/046024 dated Oct. 31, 2016 (10 pp.).

*Primary Examiner* — Robert Pascal
*Assistant Examiner* — Kimberly Glenn
(74) *Attorney, Agent, or Firm* — William J. Lenz, Esq.; Neal, Gerber & Eisenberg LLP

(57) ABSTRACT

A wideband tunable combiner system for a dual frequency diversity transmitter is provided that includes a tunable capacitance network. Incoherent RF signals with the same audio signal may be combined with the system into a combined RF signal for transmission on an antenna. The tunable capacitance network, in conjunction with a combiner and a band pass filter, may optimize the isolation between the incoherent RF signals and reduce intermodulation, while maintaining a wide operating bandwidth. The capacitance value of the tunable capacitance network may be selected based on the frequencies of the incoherent RF signals, RF spectrum information, or antenna loading data. An RF transmitter including the tunable combiner system may have improved spectral efficiency and performance and take advantage of available spectrum.

20 Claims, 4 Drawing Sheets

US 9,667,216 B2

WIDEBAND TUNABLE COMBINER SYSTEM

TECHNICAL FIELD

This application generally relates to a wideband tunable combiner system. In particular, this application relates to a wideband tunable combiner system including a tunable capacitance network for improving isolation and reducing intermodulation in a dual frequency diversity transmitter.

BACKGROUND

Audio production can involve the use of many components, including microphones, wireless audio transmitters, wireless audio receivers, recorders, and/or mixers for capturing, recording, and presenting the sound of productions, such as television programs, newscasts, movies, live events, and other types of productions. The microphones typically capture the sound of the production, which is wirelessly transmitted from the microphones and/or the wireless audio transmitters to the wireless audio receivers. The wireless audio receivers can be connected to a recorder and/or a mixer for recording and/or mixing the sound by a crew member, such as a production sound mixer. Electronic devices, such as computers and smartphones, may be connected to the recorder and/or mixer to allow the crew member to monitor audio levels and timecodes.

Wireless audio transmitters, wireless audio receivers, wireless microphones, and other portable wireless communication devices include antennas for transmitting radio frequency (RF) signals which contain digital or analog signals, such as modulated audio signals, data signals, and/or control signals. Users of portable wireless communication devices include stage performers, singers, actors, news reporters, and the like. One common type of portable wireless communication device is a wireless bodypack transmitter, which is typically secured on the body of a user with belt clips, straps, tape, etc. Another common type of portable wireless communication device is a wireless handheld microphone that is held by the user and includes an integrated transmitter and antenna.

Wireless transmitters may utilize frequency diversity to simultaneously transmit on one antenna two RF signals of two separate frequencies in a combined RF signal, where the two RF signals both include the same audio signal. This can help ensure that a wireless receiver that receives the combined RF signal will be able to process the audio signal in an uninterrupted manner by using one or both of the underlying RF signals. For example, in the case of interference on one of the RF signals on one frequency, the wireless receiver may utilize the other RF signal on the other frequency. Therefore, a wireless transmitter utilizing frequency diversity can modulate an audio signal into two incoherent RF signals of different frequencies, then combine the two RF signals together into a combined RF signal for transmission on a single antenna.

When combining two incoherent RF signals, it is desirable to isolate the two RF signals from one another as much as possible to reduce intermodulation as this is more spectrally efficient, i.e., a more optimal use of spectrum. As such, larger intermodulation products can lead to reduction of available spectrum for other usage as well as interference and/or reduced audio clarity for other wireless transmitters sharing the same spectrum. Using a Wilkinson combiner, for example, to combine the two RF signals leverages resistance between the RF signals to increase isolation and reduce intermodulation. Wilkinson combiners are typically implemented in single or multiple stages, depending on the needs of a particular application. However, while a Wilkinson combiner can provide high isolation, it also has a limited bandwidth that may not be suitable for use in certain applications and environments. In particular, the limited bandwidth of a typical Wilkinson combiner may hamper a wireless transmitter from being able to take advantage of available spectrum and thus be spectrally inefficient. In addition, a filter on the output of a multiple stage Wilkinson combiner may influence the ability to achieve a desired transmitter bandwidth while maintaining sufficient isolation between the RF signals and balanced impedance between stages of the combiner.

Accordingly, there is an opportunity for a combiner system that addresses these concerns. More particularly, there is an opportunity for a wideband tunable combiner system including a tunable capacitance network for improving isolation and reducing intermodulation in a dual frequency diversity transmitter.

SUMMARY

The invention is intended to solve the above-noted problems by providing tunable combiner systems and methods that are designed to, among other things: (1) combine incoherent RF signals in a frequency diversity transmitter with optimal isolation and reduced intermodulation: (2) maintain a wide operating bandwidth; (3) improve the spectral efficiency and performance of the transmitter; and (4) balance the impedance between stages of a combiner in the system.

In an embodiment, a tunable combiner system may include a combiner having first, second, and third ports, where the combiner may be configured to combine a first RF signal received at the first port and a second RF signal received at the second port into a combined RF signal at the third port. Each of the first and second RF signals may contain an audio signal modulated at a first frequency and a second frequency, respectively. The tunable combiner system may also include a tunable capacitance network coupled to the third port of the combiner, and a band pass filter having an input coupled to the tunable capacitance network and an output for coupling to a transmitting antenna.

In another embodiment, a method of combining first and second RF signals may include combining the first RF signal received at a first port of a combiner and the second RF signal received at a second port of the combiner into a combined RF signal at a third port of the combiner. Each of the first and second RF signals may contain an audio signal modulated at a first frequency and a second frequency, respectively. The method may also include determining a capacitance value of a tunable capacitance network coupled to the third port of the combiner, setting the determined capacitance value of the tunable capacitance network, and band pass filtering the combined RF signal into a filtered combined RF signal using a band pass filter. The band pass filter may have an input coupled to the tunable capacitance network and an output for coupling to a transmitting antenna.

These and other embodiments, and various permutations and aspects, will become apparent and be more fully understood from the following detailed description and accompanying drawings, which set forth illustrative embodiments that are indicative of the various ways in which the principles of the invention may be employed.

DETAILED DESCRIPTION

Figure 1:
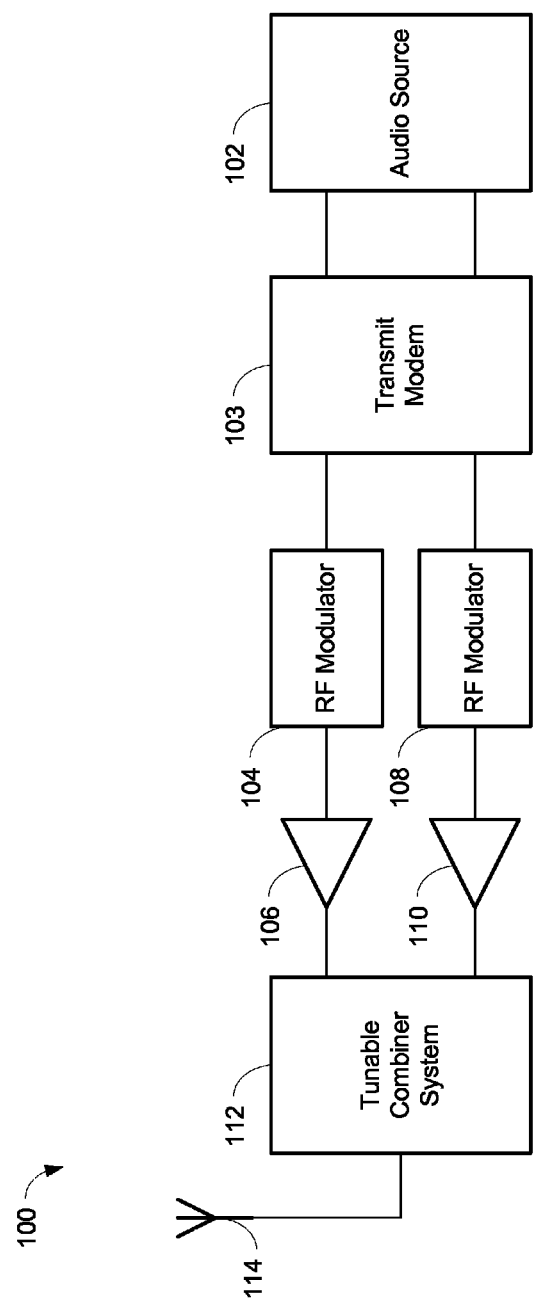
FIG. 1 is an exemplary schematic of an RF transmitter including a tunable combiner system, in accordance with some embodiments.

The description that follows describes, illustrates and exemplifies one or more particular embodiments of the invention in accordance with its principles. This description is not provided to limit the invention to the embodiments described herein, but rather to explain and teach the principles of the invention in such a way to enable one of ordinary skill in the art to understand these principles and, with that understanding, be able to apply them to practice not only the embodiments described herein, but also other embodiments that may come to mind in accordance with these principles. The scope of the invention is intended to cover all such embodiments that may fall within the scope of the appended claims, either literally or under the doctrine of equivalents.

It should be noted that in the description and drawings, like or substantially similar elements may be labeled with the same reference numerals. However, sometimes these elements may be labeled with differing numbers, such as, for example, in cases where such labeling facilitates a more clear description. Additionally, the drawings set forth herein are not necessarily drawn to scale, and in some instances proportions may have been exaggerated to more clearly depict certain features. Such labeling and drawing practices do not necessarily implicate an underlying substantive purpose. As stated above, the specification is intended to be taken as a whole and interpreted in accordance with the principles of the invention as taught herein and understood to one of ordinary skill in the art.

The tunable combiner system described herein can be utilized in a frequency diversity RF transmitter to combine incoherent RF signals into a combined RF signal for transmission on a single antenna while optimally isolating the RF signals, maintaining a wide operating bandwidth, and reducing intermodulation. The tunable combiner system may also help to balance the impedance between the stages of a combiner included within the system. A tunable capacitance network within the tunable combiner system enables active tuning of the isolation between the RF signals by manipulating inter-stage reflections in the combiner. Accordingly, the tunable combiner system may improve the spectral efficiency and performance of the RF transmitter and increase the bandwidth of a transmitter so that the transmitter can take advantage of the available spectrum.

FIG. 1 is an exemplary schematic of an embodiment of an RF transmitter 100 including a tunable combiner system 112. The RF transmitter 100 may be a frequency diversity transmitter that transmits a combined RF signal on an antenna 114. The combined RF signal may be made up of two RF signals that each contains the same audio signal. An audio source 102, such as a microphone or playback device, may detect and/or produce the audio signal. For example, if the audio source is a microphone, sound may be detected and converted into an audio signal. The audio source 102 may produce an audio signal that is modulated and transmitted by the RF transmitter 100. For the RF transmitter 100 to utilize frequency diversity, the audio signal produced by the audio source 102 may be received by a transmit modem 103 that processes and converts the audio signal and generates in-phase (I) and quadrature (Q) signals, as is known in the art. The I and Q signals may then be received by separate RF modulators 104, 108. The RF modulators 104, 108 may modulate the audio signal according to an analog or digital modulation scheme at two different frequencies. For example, the audio signal may be modulated to RF signals at 473 MHz and 479 MHz, but may be modulated at other suitable frequencies. In some embodiments, the RF transmitter 100 may be able to operate at greater than 25% fractional bandwidth in the UHF band.

The two RF signals generated by the RF modulators 104, 108 may be amplified by matched amplifiers 106, 110, respectively. The two amplified RF signals may be combined by the tunable combiner system 112 such that a combined RF signal with the two amplified RF signals may be transmitted on the antenna 114. In this way, an RF receiver that receives the combined RF signal may be more likely to process the audio signal in an uninterrupted manner due to the multiple frequencies of the underlying amplified RF signals. It should be noted that the RF transmitter 100 depicted in FIG. 1 is simplified and may include other components (not shown) that are not directly pertinent to the current disclosure, such as switches, oscillators, synthesizers, etc.

Figure 2:
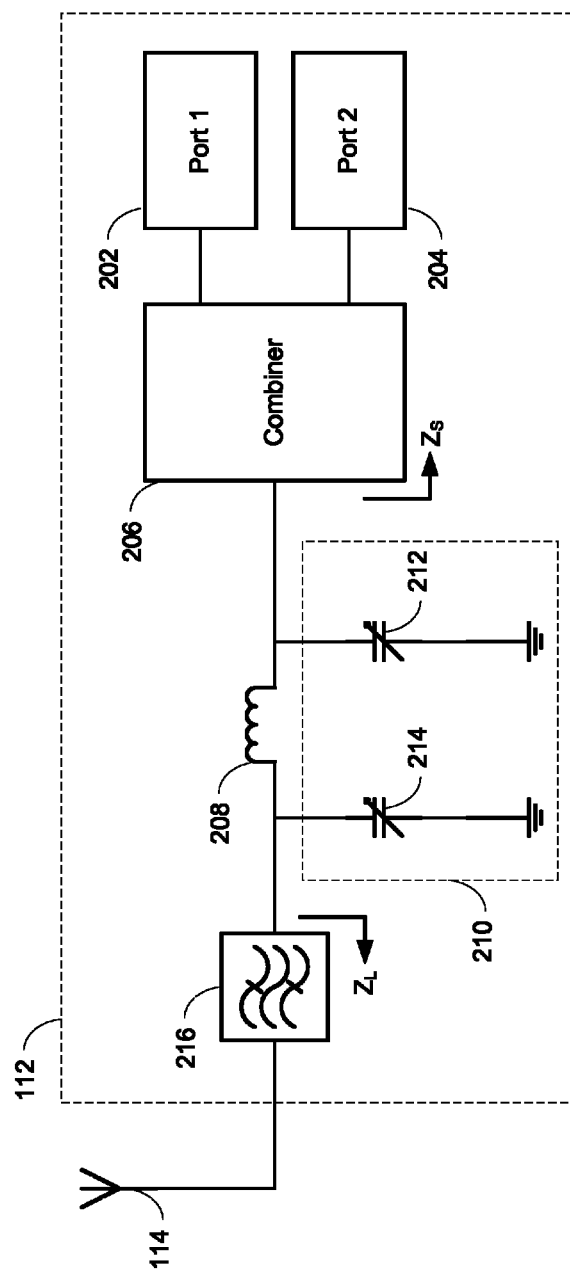
FIG. 2 is an exemplary schematic of a tunable combiner system, in accordance with some embodiments.

FIG. 2 is an exemplary schematic of an embodiment of a tunable combiner system 112 including a combiner 206, an inductor 208, a tunable capacitance network 210, and a band pass filter 216. The tunable combiner system 112 may be coupled with the antenna 114 for transmitting a combined RF signal. Two ports 202, 204 may be coupled to components not shown in FIG. 2 (e.g., the amplifiers 106, 110 depicted in FIG. 1) for receiving RF signals that are to be combined by the tunable combiner system 112. As described previously, each of the RF signals contain the same audio signal but are modulated to different frequencies. The RF signals received at ports 202, 204 may be received by a combiner 206. The combiner 206 may be a dual stage Wilkinson combiner, in some embodiments, and may combine the two RF signals into a combined RF signal that is output by the combiner 206. In other embodiments, the combiner 206 may be a discrete branch-line combiner or discrete hybrid combiner.

The tunable capacitance network 210 may include two tunable capacitors 212, 214. One tunable capacitor 212 may be coupled to the output of the combiner 206 and ground, and the other tunable capacitor 214 may be coupled to an input of a band pass filter 216 and ground. Accordingly, the tunable capacitors 212, 214 may be variable shunt capacitors. An inductor 208 is coupled between the tunable capacitors 212, 214. The inductor 208 is part of an output transformer leg of the combiner 206, as described in more detail below. The band pass filter 216 may filter the combined RF signal from the combiner 206 into a filtered combined RF signal by rejecting and attenuating undesired signals that are out of the frequency band being transmitted by the RF transmitter 100. For example, the signals rejected and attenuated by the band pass filter 216 may include spurious emissions, such as second harmonics that have been generated by amplifiers. The filtered combined RF signal may be output by the band pass filter 216 and transmitted on the antenna 114.

The tunable capacitance network 210 and inductor 208 effectively allow tuning of the isolation between the RF signals in the combiner 206 across a wider operating bandwidth. In particular, the isolation between the RF signals in the combiner 206 may be improved by appropriately selecting the capacitance values of the tunable capacitors 212, 214. Furthermore, the inter-stage match between the source impedance $Z_S$ of the combiner 206 and the load impedance $Z_L$ of the band pass filter 216 may be improved by the appropriate selection of the capacitance values of the tunable capacitors 212, 214.

The tunable capacitors 212, 214 may be digitally tunable capacitors that are controllable by a processor, such as through a serial interface or other control port. The digitally tunable capacitors may include, for example, microelectromechanical capacitors and/or switched discrete capacitors using at least one diode. The tunable capacitors 212, 214 may be a PE64101 digitally tunable capacitor from Peregrine Semiconductor Corp., for example.

In one embodiment, the capacitance values of the tunable capacitors 212, 214 may be determined based on the frequencies of the RF signals. For example, a processor may query a lookup table with the frequencies of the RF signals so that suitable capacitance values of the tunable capacitors 212, 214 are determined that provide maximum isolation for those frequencies. The possible capacitance values of the tunable capacitors 212, 214 may have been predetermined and stored in the lookup table as associated with the possible frequencies of the RF signals. The lookup table may be stored in a memory in communication with the processor, for example.

In another embodiment, the capacitance values of the tunable capacitors 212, 214 may be actively controlled and determined based on measurements of the RF spectrum. For example, the RF spectrum may be continuously scanned, monitored, and analyzed to measure intermodulation values. Based on the measured intermodulation values, suitable capacitance values of the tunable capacitors 212, 214 may be determined so that intermodulation products are minimized.

In a further embodiment, the capacitance values of the tunable capacitors 212, 214 may be actively controlled and determined based on antenna loading data associated with the antenna 114. For example, a near field RF signal may be sensed so that the suitable capacitance values of the tunable capacitors 212, 214 are determined that provide maximum isolation for the frequencies of the RF signals being used. Embodiments of an adaptive self-tunable antenna system for sensing antenna loading are described in commonly assigned U.S. Pat. App. Pub. No. 2015/0162897, which is hereby incorporated by reference in its entirety.

Figure 3:
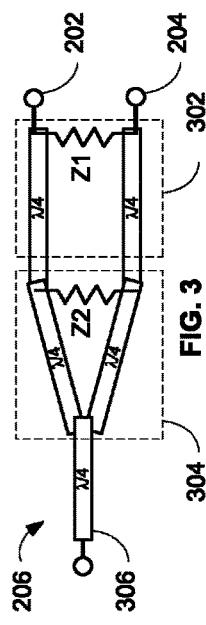
FIG. 3 is a exemplary schematic of a dual stage Wilkinson combiner with an output transformer leg, in accordance with some embodiments.
Figure 4:
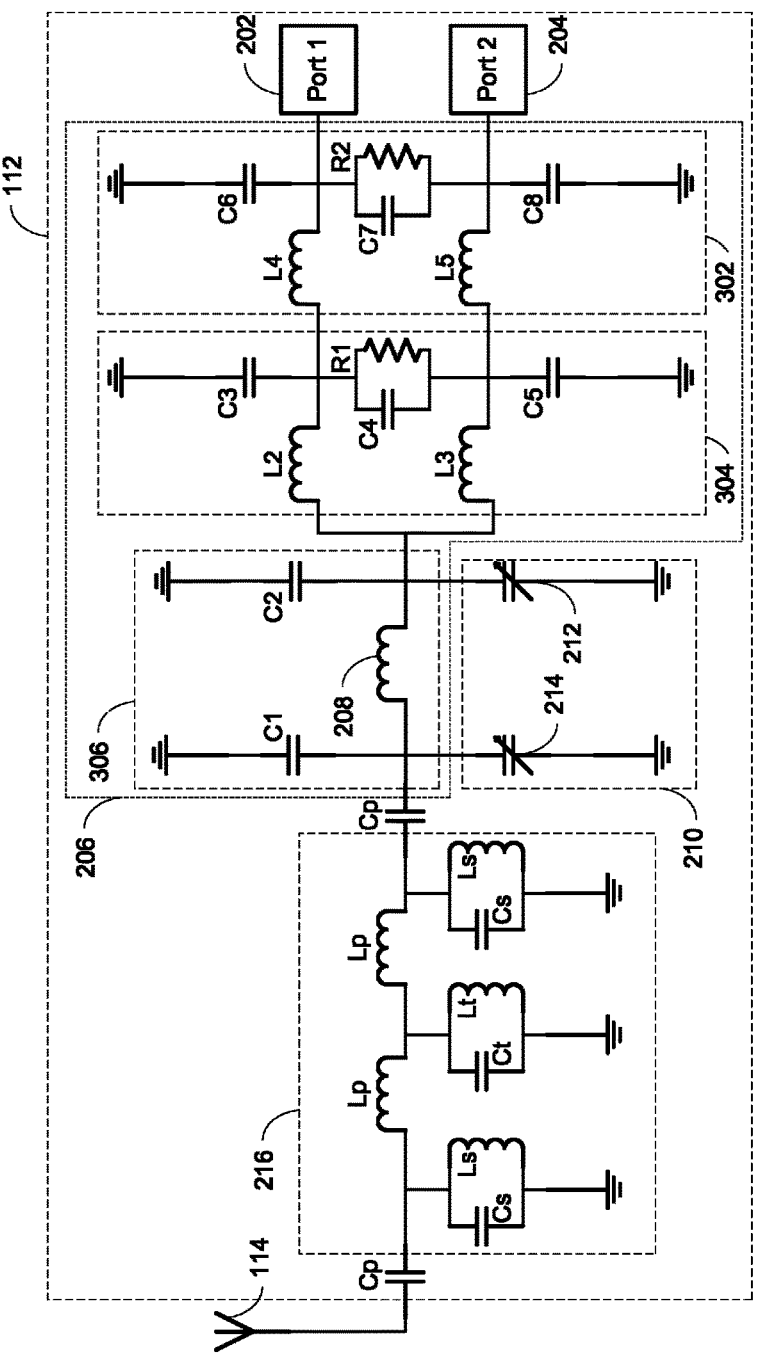
FIG. 4 is a detailed exemplary schematic of a tunable combiner system, in accordance with some embodiments.

FIG. 4 is an exemplary schematic of an embodiment of the tunable combiner system 112 that includes further details of the discrete components that make up the combiner 206 and band pass filter 216. As described previously, the two ports 202, 204 may receive RF signals from outside the tunable combiner system 112, such as the amplifier 106, 110 depicted in FIG. 1. The RF signals may be combined by the tunable combiner system 112 into a combined RF signal, and in particular, by the combiner 206. The combiner 206 may be a discrete dual stage Wilkinson combiner with an output transformer leg 306, as depicted in FIGS. 3 and 4. A dual stage Wilkinson combiner may include quarter wave transmission lines (denoted with λ/4 in FIG. 3) for combining the RF signals into the combined RF signal. Each section of the quarter wave transmission line may be implemented in a discrete inductor-capacitor (LC) pi-topology.

In particular, the combiner 206 may include a first stage 302 that includes the first section of the quarter wave transmission line for the RF signal received on port 202 (using an inductor L4 and a capacitor C6) and the first section of the quarter wave transmission line for the RF signal received on port 204 (using an inductor L5 and a capacitor C8). The combiner 206 may further include a second stage 304 that includes the second section of the quarter wave transmission line for the RF signal received on port 202 (using an inductor L2 and a capacitor C3) and the second section of the quarter wave transmission line for the RF signal received on port 204 (using an inductor L3 and a capacitor C5). The isolation between the two RF signals received at ports 202 and 204 may be defined by the resistance determined by the resistor-capacitor (RC) banks between the sections (i.e., Z1: resistor R2-capacitor C7 in the first stage 302, and Z2: resistor R1-capacitor C4 in the second stage 304). The values of the components in the first stage 302 and the second stage 304 may be selected so as to provide optimal insertion loss and return loss for the combiner 206.

The combiner 206 also includes an output transformer leg 306 that includes the inductor 208 and capacitors C1 and C2. The output transformer leg 306 is coupled to the tunable capacitance network 210, as shown in FIG. 4. In particular, the capacitor C2 is in parallel to ground with the tunable capacitor 212 and the capacitor C1 is in parallel to ground with the tunable capacitor 214. As previously described, selecting suitable values of the capacitance values of the tunable capacitors 212, 214 allow the tunable combiner system 112 to have a wider bandwidth while optimally isolating the RF signals in the first and second stages 302, 304 of the combiner 206. The band pass filter 216 is coupled to the combiner 206 and tunable capacitance network 210 and is composed of discrete inductors Lp, Ls, Lt and discrete capacitors Cs, Ct, as shown in FIG. 4. The capacitors Cp act as blocking capacitors between the band pass filter 216 and the antenna 114, and between the band pass filter 216 and the other components of the combiner 112.

Suitable values of the discrete components of the tunable combiner system 112 may be determined based on simulation and evaluation such that the insertion loss is minimized from ports 202, 204 to the antenna 114. The simulation and evaluation may also be utilized to determine the resonant frequency of isolation between port 202 and port 204. The tunable capacitance network 210 (i.e., tunable capacitors 212, 214) may be used to vary the resonant frequency with respect to the isolation between port 202 and port 404, while having minimal impact on the insertion loss from ports 202, 204 to the antenna 114.

Figure 5:
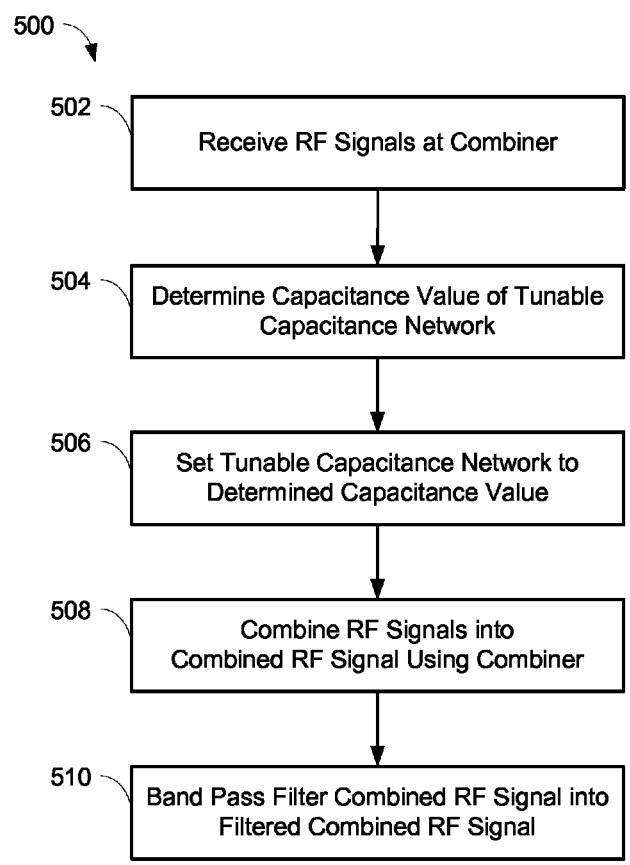
FIG. 5 is a flowchart illustrating operations for combining RF signals using a tunable combiner system, in accordance with some embodiments.

An embodiment of a process 500 for combining RF signals using the tunable combiner system 112 is shown in FIG. 5. The process 500 can result in a filtered combined RF signal that can be transmitted on an antenna. The filtered combined RF signal may include two RF signals at different frequencies that each contains an audio signal. One or more processors and/or other processing components (e.g., analog to digital converters, encryption chips, etc.) may perform any, some, or all of the steps of the process 500. One or more other types of components (e.g., memory, input and/or output devices, transmitters, receivers, buffers, drivers, discrete components, etc.) may also be utilized in conjunction with the processors and/or other processing components to perform any, some, or all of the steps of the process 500. The processors and/or other processing components may also perform other functionality within the tunable combiner system 112 and/or RF transmitter 100.

At step 502, two RF signals may be received at a combiner in the tunable combiner system. Each of the two RF signals may contain an audio signal that has been modulated according to an analog or digital modulation scheme at different frequencies, for example. The two RF signals will be combined by the combiner in the process 500. At step 504, the capacitance value of a tunable capacitance network may be determined. The tunable capacitance network may be coupled to an output port of the combiner that outputs the combined RF signal. The determined capacitance value may be set on the tunable capacitance network at step 506. The capacitance value of the tunable capacitance network is determined in order to provide maximum isolation between the RF signals in the combiner while providing a wide operating bandwidth.

In some embodiments, the capacitance value may be determined at step 504 based on the frequencies of the first and second RF signals. For example, a processor may query a lookup table with the frequencies of the RF signals so that the suitable capacitance values of the tunable capacitors 212, 214 are determined that provide maximum isolation for those frequencies. The possible capacitance values of the tunable capacitors 212, 214 may have been predetermined and stored in the lookup table as associated with possible frequencies of RF signals. In other embodiments, the capacitance value may be determined at step 504 based on measurements of the RF spectrum and/or the loading of the transmitting antenna. The tunable capacitance network may include one, two, or more digitally tunable capacitors, and may be controllable by a processor in some embodiments. For example, the digitally tunable capacitors may be controlled through a serial interface or other control port by the processor.

At step 508, the two RF signals may be combined with the combiner into a combined RF signal. In embodiments, the combiner may be a dual stage Wilkinson combiner with an output transformer leg, as described previously. The first RF signal may be received at a first port of the combiner, the second RF signal may be received at a second port of the combiner, and the combined RF signal may be output on the output port of the combiner. In other embodiments, the combiner may be a discrete branch-line combiner or discrete hybrid combiner.

At step 510, the combined RF signal may be band pass filtered into a filtered combined RF signal. An input of the band pass filter utilized at step 510 may be coupled to the tunable capacitance network and the output of the combiner, and the output of the band pass filter may be coupled to a transmitting antenna. The band pass filtering at step 510 may filter the combined RF signal from the combiner by rejecting and attenuating undesired signals that are out of the frequency band being transmitted by the RF transmitter 100. The undesired signals may include, for example, spurious emissions such as second harmonics that have been generated by amplifiers. The filtered combined RF signal may be transmitted on an antenna.

Any process descriptions or blocks in figures should be understood as representing modules, segments, or portions of code which include one or more executable instructions for implementing specific logical functions or steps in the process, and alternate implementations are included within the scope of the embodiments of the invention in which functions may be executed out of order from that shown or discussed, including substantially concurrently or in reverse order, depending on the functionality involved, as would be understood by those having ordinary skill in the art.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) were chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the embodiments as determined by the appended claims, as may be amended during the pendency of this application for patent, and all equivalents thereof, when interpreted in accordance with the breadth to which they are fairly, legally and equitably entitled.

The invention claimed is:

1. A tunable combiner system, comprising:
 a combiner having first, second, and third ports, the combiner configured to combine a first radio frequency (RF) signal received at the first port and a second RF signal received at the second port into a combined RF signal at the third port, wherein each of the first and second RF signals contains an audio signal modulated at a first frequency and a second frequency, respectively;
 a tunable capacitance network coupled to the third port of the combiner; and
 a band pass filter having an input coupled to the tunable capacitance network and an output for coupling to a transmitting antenna.

2. The tunable combiner system of claim 1, wherein the tunable capacitance network comprises:
 a first tunable capacitor coupled to the third port of the combiner and ground; and
 a second tunable capacitor coupled to the input of the band pass filter and ground.

3. The tunable combiner system of claim 2, wherein the combiner comprises a Wilkinson combiner.

4. The tunable combiner system of claim 3, wherein the Wilkinson combiner comprises a dual stage Wilkinson combiner with an output transformer leg.

5. The tunable combiner system of claim 4, wherein the output transformer leg comprises:
 a first capacitor in parallel to ground with the first tunable capacitor;
 a second capacitor in parallel to ground with the second tunable capacitor; and
 an inductor coupled to the first capacitor, the second capacitor, the first tunable capacitor, and the second tunable capacitor.

6. The tunable combiner system of claim 1, wherein the band pass filter is comprised of discrete components.

7. The tunable combiner system of claim 2, wherein each of the first and second tunable capacitors comprises a digitally tunable capacitor.

8. The tunable combiner system of claim 7, wherein the digitally tunable capacitor comprises a microelectromechanical capacitor.

9. The tunable combiner system of claim 7, wherein the digitally tunable capacitor comprises a switched discrete capacitor comprising at least one diode.

10. The tunable combiner system of claim 2, wherein capacitance values of the first and second tunable capacitors are determined based on the first frequency of the first RF signal and the second frequency of the second RF signal.

11. The tunable combiner system of claim 10, further comprising a processor in communication with the first and second tunable capacitors, the processor configured to:
receive the first frequency of the first RF signal and the second frequency of the second RF signal;
determine the capacitance values of the first and second tunable capacitors based on the first and second frequencies of the first and second RF signals, respectively; and
set the capacitance values of the first and second tunable capacitors.

12. The tunable combiner system of claim 2, further comprising a processor in communication with the first and second tunable capacitors, the processor configured to:
receive antenna loading data associated with the transmitting antenna;
determine capacitance values of the first and second tunable capacitors based on the antenna loading data; and
set the capacitance values of the first and second tunable capacitors.

13. A method of combining a first radio frequency (RF) signal and a second RF signal, comprising:
receiving the first RF signal at a first port of a combiner and the second RF signal at a second port of the combiner, wherein each of the first and second RF signals contains an audio signal modulated at a first frequency and a second frequency, respectively;
determining a capacitance value of a tunable capacitance network coupled to an output port of the combiner;
setting the determined capacitance value of the tunable capacitance network;
combining the first and second RF signals with the combiner into a combined RF signal at the output port of the combiner; and
band pass filtering the combined RF signal into a filtered combined RF signal using a band pass filter, the band pass filter having an input coupled to the tunable capacitance network and an output for coupling to a transmitting antenna.

14. The method of claim 13, wherein determining the capacitance value of the tunable capacitance network comprises determining capacitance values of the tunable capacitance network based on the first and second frequencies of the first and second RF signals, respectively, using a processor.

15. The method of claim 14, wherein determining the capacitance values of the tunable capacitance network comprises querying a lookup table with the first and second frequencies, using the processor, the lookup table stored in a memory in communication with the processor.

16. The method of claim 13, wherein the tunable capacitance network comprises:
a first tunable capacitor coupled to the output port of the combiner and ground; and
a second tunable capacitor coupled to the input of the band pass filter and ground.

17. The method of claim 16, wherein:
determining the capacitance value of the tunable capacitance network comprises determining capacitance values of the first and second tunable capacitors based on the first and second frequencies of the first and second RF signals, respectively, using a processor; and
setting the determined capacitance value of the tunable capacitance network comprises setting the determined capacitance values of the first and second tunable capacitors, using the processor.

18. The method of claim 13, wherein determining the capacitance values of the tunable capacitance network comprises determining capacitance values of the tunable capacitance network based on measurements of intermodulation values in the RF spectrum.

19. The method of claim 13, wherein determining the capacitance values of the tunable capacitance network comprises determining capacitance values of the tunable capacitance network based on antenna loading data associated with the transmitting antenna.

20. The method of claim 13, wherein the combiner comprises a Wilkinson combiner.

* * * * *